United States Patent [19]

Lee

[11] Patent Number: 5,677,550
[45] Date of Patent: Oct. 14, 1997

[54] INTEGRATED CIRCUIT DEVICES INCLUDING INSULATED-GATE TRANSISTOR DEVICE HAVING TWO SEPARATELY BIASABLE GATES

[75] Inventor: Michael John Lee, High Wycombe, England

[73] Assignee: British Technology Group Limited, London, England

[21] Appl. No.: 318,767

[22] PCT Filed: Apr. 15, 1993

[86] PCT No.: PCT/GB93/00792

§ 371 Date: Oct. 14, 1994

§ 102(e) Date: Oct. 14, 1994

[87] PCT Pub. No.: WO93/21659

PCT Pub. Date: Oct. 28, 1993

[30] Foreign Application Priority Data

Apr. 15, 1992 [GB] United Kingdom ............... 9208324

[51] Int. Cl.⁶ .................................................. H01L 29/78
[52] U.S. Cl. ............................... 257/69; 257/392
[58] Field of Search ........................ 257/392, 409, 257/66, 69

[56] References Cited

U.S. PATENT DOCUMENTS

| 4,040,073 | 8/1977 | Luo | 257/66 |
| 4,803,530 | 2/1989 | Taguchi et al. | 257/352 |
| 4,963,860 | 10/1990 | Stewart | 340/719 |
| 5,053,347 | 10/1991 | Wu | 257/57 |

FOREIGN PATENT DOCUMENTS

| 0006001 | 12/1979 | European Pat. Off. |
| 0308128 | 3/1989 | European Pat. Off. |
| 9006595 | 6/1990 | WIPO |

OTHER PUBLICATIONS

Patent Abstract of Japan, vol. 007, No. 021 (E-155) 27 Jan. 1983 & JP, A, 57 180 177 (Tokyo Shibaura Denki KK) 6 Nov. 1982 see abstract.

IBM Technical Disclosure Bulletin, vol. 20, No. 12 May 1978, New York US p. 5352 F.F. Fang"TFT Structure with Electronically Adjustable Threshold".

Patent Abstract of Japan vol. 015, No. 229 (E-1076) 11 Jun. 1991 & JP, A, 30 66 159 (Mitsubishi Electric Corp.) 20 Mar. 1991—see Abstract.

IEEE Electron Device Letters, vol. 13, No. 1, Jan. 1992, New York US, pp. 17–19 Biing-Seng Wu et al "A Novel Depletion-Gate Amorphous Silicon thin-Film Transistor" see whole document.

*Primary Examiner*—Tom Thomas
*Assistant Examiner*—David B. Hardy
*Attorney, Agent, or Firm*—Cushman, Darby & Cushman IP Group of Pillsbury Madison & Sutro LLP

[57] ABSTRACT

An integrated circuit arrangement comprising a pair of double-gated insulated-gate transistor devices connectible in series, the first transistor of the pair being biased by one of the gates of the device so as to be operable as a depletion-mode device whilst the second transistor of the pair is biased by one of its two gates so as to be operable as an enhancement-mode device. The separately-biasable gate electrode permits the threshold voltage of the transistors to be adjusted independently so that the device may operate as either a depletion-mode transistor or as an enhancement mode transistor.

9 Claims, 4 Drawing Sheets

INTEGRATED CIRCUIT DEVICES INCLUDING INSULATED-GATE TRANSISTOR DEVICE HAVING TWO SEPARATELY BIASABLE GATES

FIELD OF THE INVENTION

This invention relates to semiconductor devices and, in particular, to the fabrication of thin film transistors and integrated circuits incorporating such transistors.

BACKGROUND OF RELATED ART

In designing circuits for integrated electronics it is an advantage to have more than one type of active device available—for example CMOS has n and p channel devices and most n-MOS integrated circuit fabrication processes allow selective variation of the threshold voltage, in particular with the simultaneous fabrication of enhancement and depletion mode devices. For an n-channel enhancement mode device the minimum current (off state) flows with zero applied gate voltage and is increased by applying a positive gate voltage (on state). Conversely, for a depletion mode device a negative gate voltage is applied to turn the device off whilst at zero gate voltage the device is in the on state.

In n-MOS circuits use of enhancement-depletion mode circuitry gives improved performance when compared with enhancement mode-only circuits, in terms of switching speed, output voltage levels, and power consumption.

As indicated above, improved circuit performance is possible if depletion mode devices are also available. Possible ways to produce depletion type thin film active devices are to increase the semiconductor film thickness for the depletion mode devices as compared to the enhancement mode devices, or to selectively add n-type dopant material into the channel region of the depletion mode devices. In either case additional process steps would be needed, involving the use of extra mask layers, and hence increased cost and reduced yield. Depletion and enhancement mode devices may also be produced by using different geometries of the CdSe layers without an additional mask step.

SUMMARY OF THE INVENTION

We have devised a process using cadmium selenide which produces a double gated n-channel enhancement mode device, combining the desirable characteristics of high speed operation due to the high carrier mobility, high on current and low off current.

It has been found possible to produce depletion-mode TFTs without any additional processing steps by biasing one of the gates of the device to control the threshold voltage of the device so that it has a suitable (negative) value and so that it operates as either a depletion mode device or as an enhancement mode device. Thus the TFTs can be made to be enhancement or depletion types as required, with both types co-existing in the same circuit.

No alterations to the fabrication process are needed, and no additional mask layers, merely a small variation in mask design to allow separate control of the potential of both gates of each of the TFTs. An externally applied voltage is applied to one gate of the depletion mode devices in the circuit to set the required threshold voltage.

According to the present invention there is provided an integrated circuit arrangement comprising a pair of insulated-gate transistor devices connectible in series wherein the first transistor of the pair is operable as a depletion-mode device whilst the second transistor of the pair serves as an enhancement-mode device.

BRIEF DESCRIPTION OF THE DRAWINGS

The invention will now be particularly described with reference to the accompanying drawings, in which.

DESCRIPTION OF PREFERRED EMBODIMENTS

Figure 1:
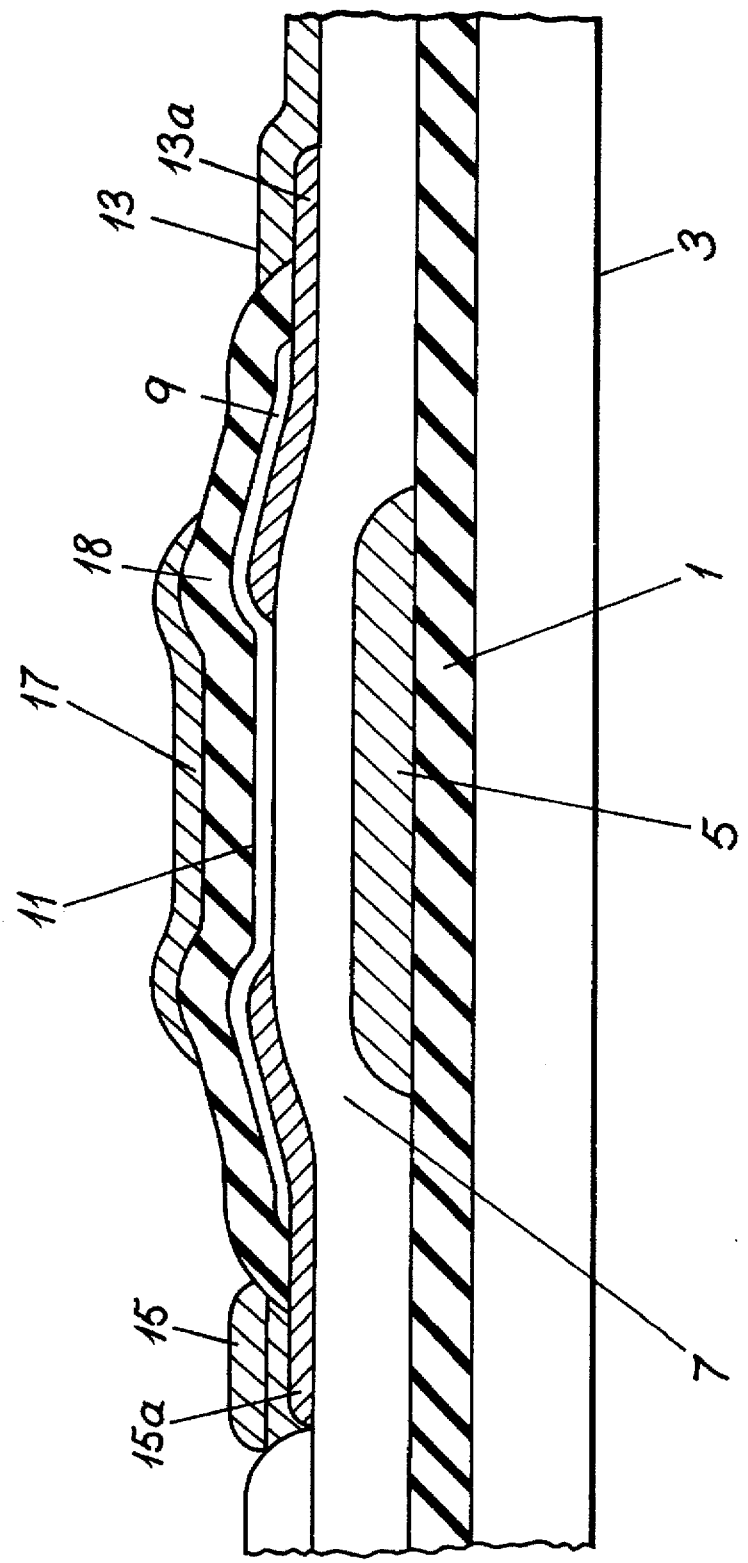
FIG. 1 is a cross-section through a thin film transistor in accordance with a specific embodiment of the invention.

Referring now to the drawings, FIG. 1 shows a cross-section through a thin film transistor in accordance with a specific embodiment of the present invention. A diffusion barrier 1 is formed on a substrate 3. The device has a bottom gate 5 separated by an insulator layer 7 from a layer of cadmium selenide 9. An n-channel region 11 is formed in this semiconductor layer. A pad contact 13 and column conductor 15 are provided for the source and drain electrodes. Conductive layers 15a, 13a provide electrical contact between the column conductor 15 and drain region of the cadmium selenide layer 9, and between the pad contact B and the conductive layer 13a. An upper (top) gate 17 is separated from the semiconductor by an insulator layer 18. Both the enchancement mode transistor and the depletion mode transistor have the saem configuration as shown in FIG. 1.

Figure 2:
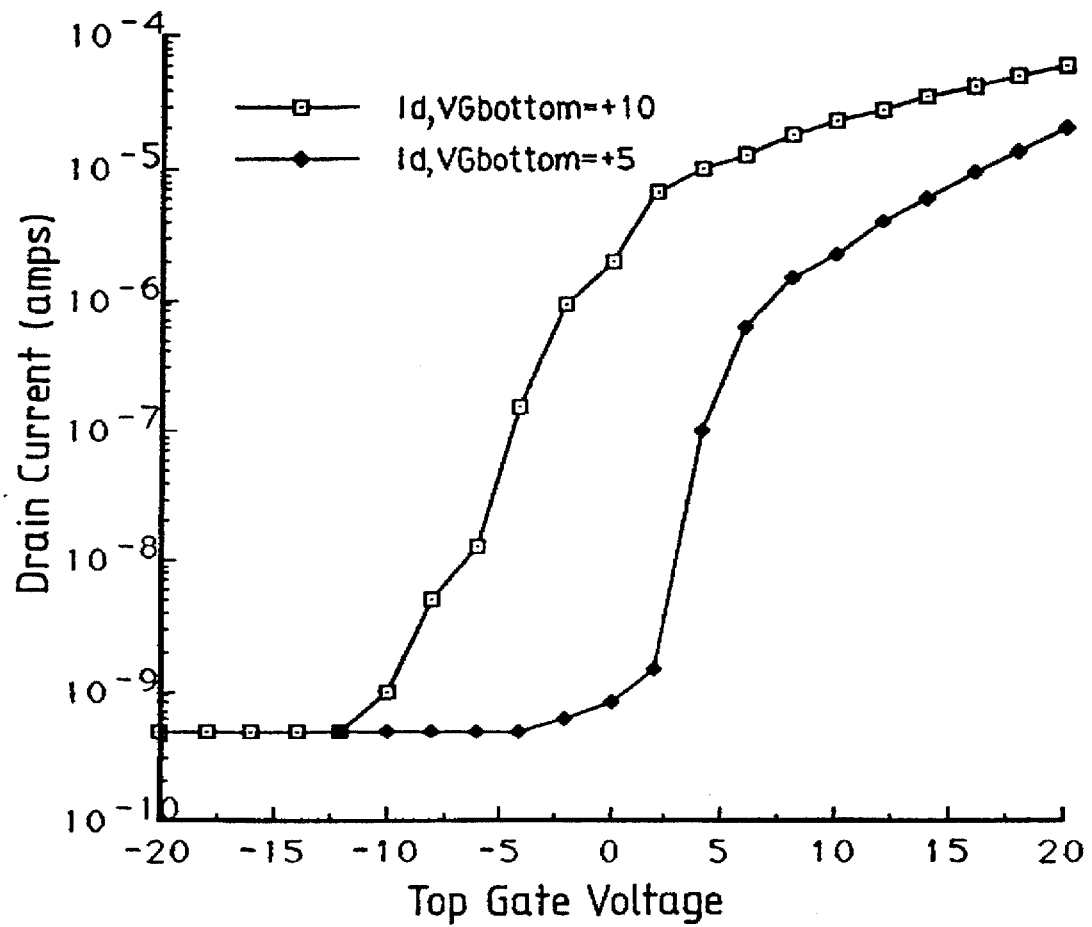
FIG. 2 shows electrical characteristics of the transistor of FIG. 1.

FIG. 2 shows the current through the transistors as a function of the top gate 17 voltage for two values of the bottom gate voltage. It is seen there is a marked difference in the position of the curves particularly in the threshold region (i.e. the steeply rising part). Thus, when the bottom gate is brased to +s volts, the transistor functions as a depletion mode transistor, and when biased to +10 volts, the transistor functions as an enhancement mode transistor.

Figure 3A:
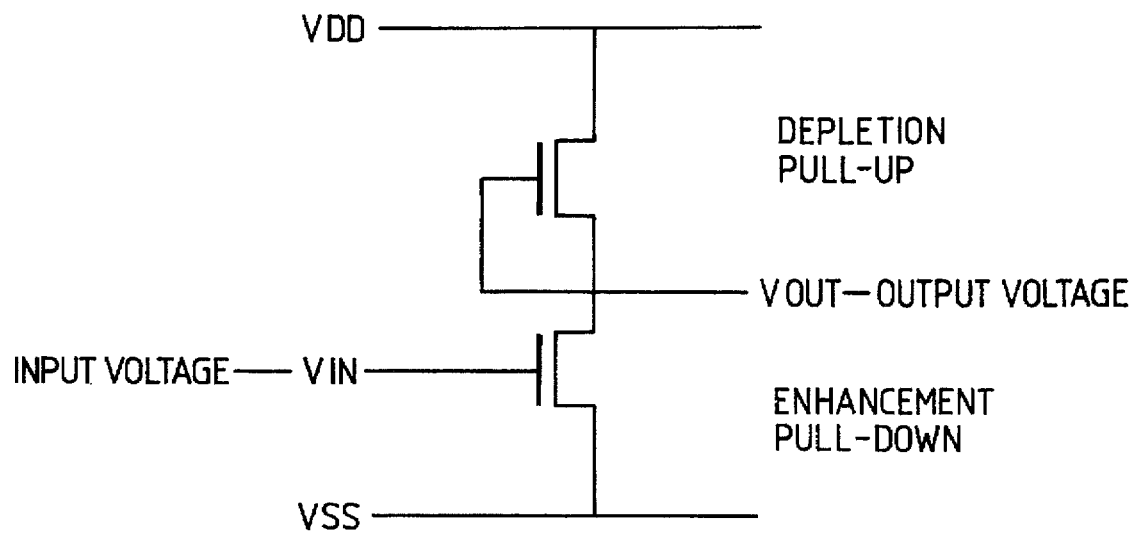
FIGS. 3A and 3B are circuit diagrams of an inverter.
Figure 3B:
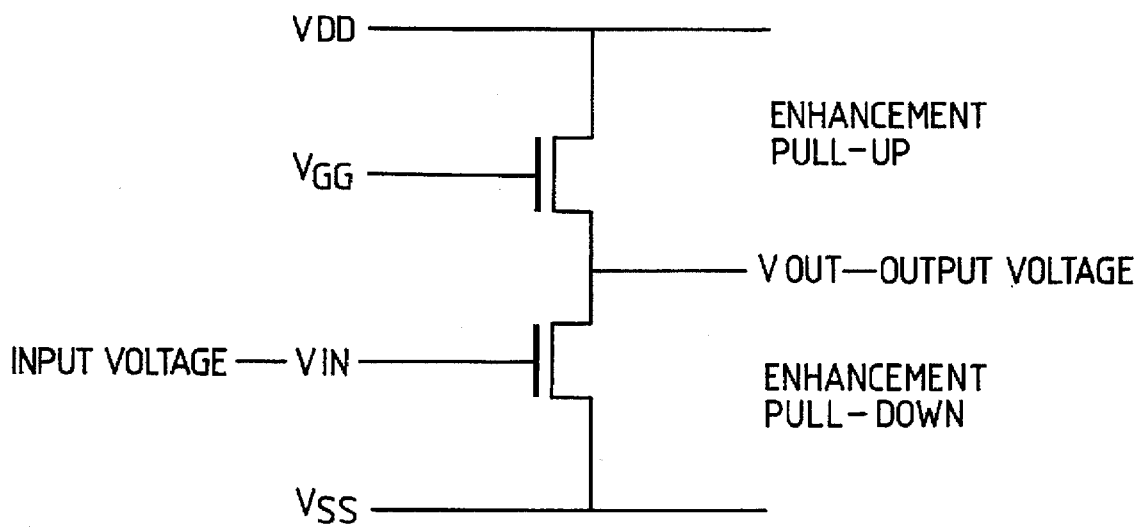
Figure 4:
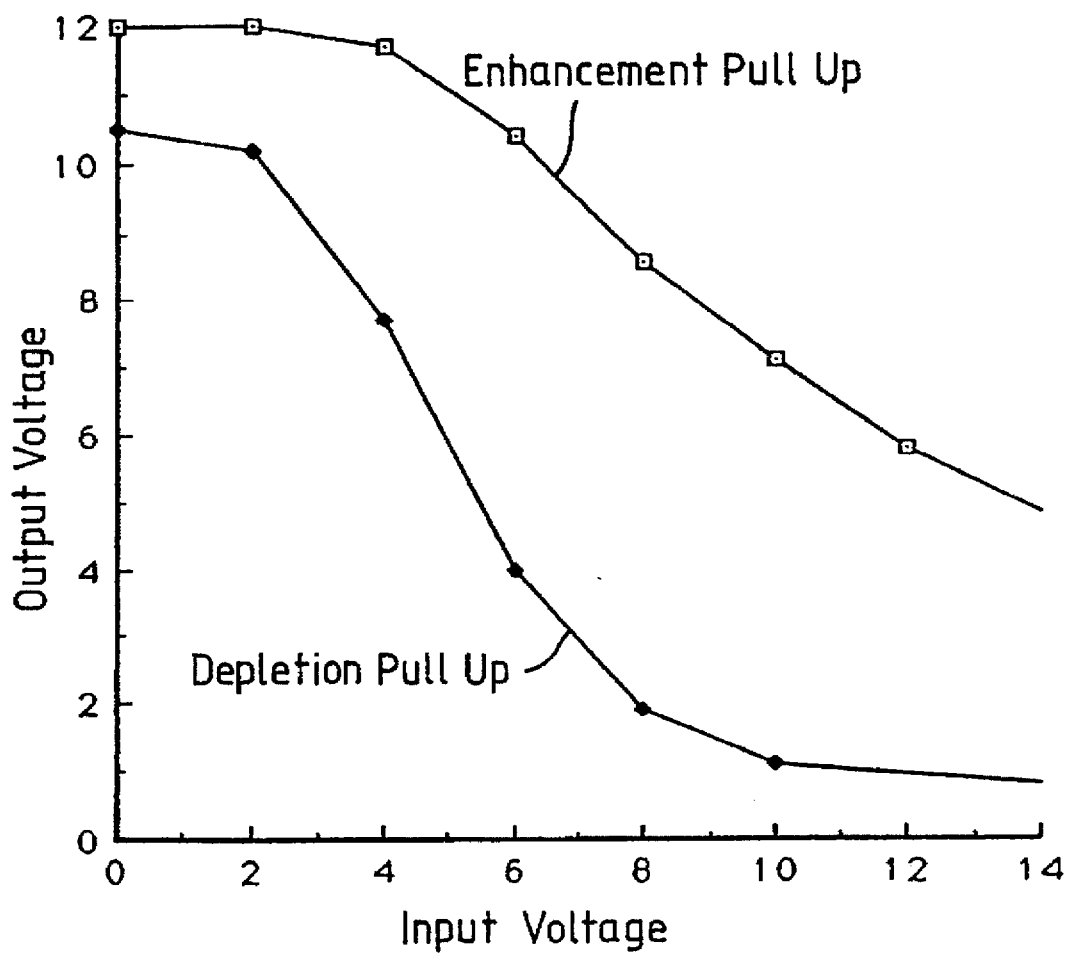
FIG. 4 shows electrical characteristics of this inverter.

FIGS. 3A and 3B show the circuit diagrams of an inverter for use with the transistor of FIG. 1. Its transfer characteristics are shown in FIG. 4 where the advantage of using the depletion mode TFT as the pull-up transistor is seen in the larger voltage swings. In the example chosen an enhancement mode pull-up device would not operate a shift register.

Fabrication of enhancement and depletion type CdSe thin film transistors is simultaneously possible, with no additional masking or processing steps to those required for a purely enhancement type process.

The same technique may be applied to the production of TFTs using other semiconductor materials. In the case of polysilicon this process would compensate for the low mobility of holes in p-type material and produce enhanced circuits.

I claim:

1. An integrated circuit arrangement comprising a first double-gated insulated-gate transistor connected in series with a second double-gated insulated-gate transistor, said first double-gated insulated-gate transistor and said second double-gated insulated-gate transistor each comprising:

a source region;

a drain region;

a channel region between said source region and said drain region;

a first insulated gate to one side of said channel region; and a second insulated gate to a second side of said channel region;

said drain region of said first double-gated insulated-gate transistor being coupled electrically to said source region of said second double-gated insulated-gate transistor;

said first insulated gate of said first double-gated insulated-gate transistor being biasable to a first voltage level so as to cause said first double-gated insulated-gate transistor to operate as a depletion-mode device; and said first insulated gate of said second double-gated insulated-gate transistor being separately biasable to a second voltage different from said first voltage so as to cause said second double-gated insulated-gate transistor to operate as an enhancement-mode device.

2. An integrated circuit arrangement according to claim 1, wherein:

said channel region of each of said first double-gated insulated-gate transistor and said second double-gated insulated-gate transistor is formed of cadmium selenide.

3. An integrated circuit arrangement according to claim 1, wherein:

said channel region of each of said first double-gated insulated-gate transistor and said second double-gated insulated-gate transistor is formed of silicon.

4. An integrated circuit arrangement comprising:

a pair of insulated-gate transistor devices, wherein at least one of said pair of insulated-gate transistor devices includes two separately-biasable gates;

a drain of a first of said pair of insulated-gate transistor devices being coupled electrically to a source of a second of said pair of insulated-gate transistor devices;

a first of said pair of insulated-gate transistor devices operating as a depletion mode device, and a second of said pair of insulated-gate transistor devices operating as an enhancement mode device; and each of said pair of insulated-gate transistor devices having a channel region formed of cadmium selenide.

5. An integrated circuit arrangement according to claim 4, wherein said pair of insulated-gate transistor devices are connected to form a switching circuit.

6. An integrated circuit arrangement according to claim 4, wherein said pair of insulated-gate transistor devices are connected in series to form an inverter.

7. An integrated circuit arrangement comprising a first insulated-gate transistor connected in series with a second insulated-gate transistor, said first insulated-gate transistor and said second insulated-gate transistor each comprising:

a source region;

a drain region;

a channel region between said source region and said drain region; and a first insulated gate to one side of said channel region;

at least one of said first insulated-gate transistor and said second insulated-gate transistor further comprising a second insulated gate to a second side of said respective channel region;

said second insulated gate of said at least one of said first insulated-gate transistor and said second insulated-gate transistor being biasable so as to cause said at least one of said first insulated-gate transistor and said second insulated-gate transistor to operate as a depletion-mode device and the other of said first insulated-gate transistor and said second insulated-gate transistor to operate as an enhancement-mode device; and said drain region of said first insulated-gate transistor being coupled electrically to said source region of said second insulated-gate transistor.

8. An integrated circuit arrangement according to claim 7, wherein:

said respective channel region of said at least one of said first insulated-gate transistor and said second insulated-gate transistor is formed of cadmium selenide.

9. An integrated circuit arrangement according to claim 7, wherein:

said respective channel region of said at least one of said first insulated-gate transistor and said second insulated-gate transistor is formed of silicon.

* * * * *